United States Patent
Chae (10) Patent No.: US 12,298,904 B2
(45) Date of Patent: May 13, 2025

(54) RANDOM SEED GENERATING CIRCUIT OF MEMORY SYSTEM

(71) Applicant: SK hynix Inc., Gyeonggi-do (KR)

(72) Inventor: Chol Su Chae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 466 days.

(21) Appl. No.: 17/339,433

(22) Filed: Jun. 4, 2021

(65) Prior Publication Data

US 2022/0197792 A1 Jun. 23, 2022

(30) Foreign Application Priority Data

Dec. 23, 2020 (KR) .................. 10-2020-0182543

(51) Int. Cl.
*G06F 12/06* (2006.01)
*G06F 7/58* (2006.01)

(52) U.S. Cl.
CPC .......... *G06F 12/0646* (2013.01); *G06F 7/588* (2013.01); *G06F 2212/1056* (2013.01)

(58) Field of Classification Search
CPC .. G06F 7/58–588; G06F 9/30; G06F 12/0646; G06F 2212/1056
See application file for complete search history.

(56) References Cited

U.S. PATENT DOCUMENTS

| | | | |
|---|---|---|---|
| 9,268,531 B1 * | 2/2016 | Woo | G06F 7/58 |
| 2006/0047886 A1 * | 3/2006 | Leaback | G06F 12/0607 |
| | | | 711/202 |
| 2009/0292752 A1 * | 11/2009 | Schneider | G06F 7/582 |
| | | | 708/250 |
| 2018/0300088 A1 | 10/2018 | Sivaraman Nair et al. | |
| 2021/0373784 A1 * | 12/2021 | Atsumi | G06F 7/584 |

FOREIGN PATENT DOCUMENTS

| | | |
|---|---|---|
| KR | 20120118762 A | 10/2012 |
| KR | 20130060795 A | 6/2013 |
| KR | 20130096673 A | 8/2013 |
| KR | 10-2016-0104389 A | 9/2016 |
| WO | WO-2021249030 A1 * | 12/2021 |

OTHER PUBLICATIONS

H. Liu, Machine Translation of Liu et al. (WO 2021249030 A1), 2021. (Foreign Priority Date of PCT Application = Jun./Jul. 2020). (Year: 2021).*

* cited by examiner

*Primary Examiner* — Emily E Larocque
(74) *Attorney, Agent, or Firm* — IP & T GROUP LLP (57) ABSTRACT

A random seed generating circuit of a memory system includes a first address generating circuit, a second address generating circuit, a table circuit and a seed generating circuit. The first address generating circuit generates an initial address based on target page information. The second address generating circuit generates a plurality of table addresses based on the target page information and a plurality of partial addresses, which are divided from the initial address. The table circuit outputs, from a plurality of tables, a plurality of table values respectively corresponding to the plurality of table addresses. The seed generating circuit generates a random seed based on the plurality of table values.

21 Claims, 9 Drawing Sheets

RANDOM SEED GENERATING CIRCUIT OF MEMORY SYSTEM

CROSS-REFERENCES TO RELATED APPLICATION

The present application claims priority under 35 U.S.C. § 119(a) to Korean application number 10-2020-0182543, filed on Dec. 23, 2020, which is incorporated herein by reference in its entirety as set forth in full.

BACKGROUND

1. Technical Field

Various embodiments of the present disclosure generally relate to a random seed generating circuit and, more particularly, to a random seed generating circuit of a memory system.

2. Related Art

A memory system may be configured to store therein, in response to a write request from a host device, data provided from the host device. Also, the memory system may be configured to provide, in response to a read request from the host device, stored data to the host device. The host device may be an electronic device capable of processing data and may include a computer, a digital camera, a mobile phone and so forth. The memory system may become operable as connected to the host device. The memory system may be manufactured as embedded within the host device or as detachable from the host device.

The memory system may have a high risk that an error occurs when storing data of a particular pattern. Therefore, the memory system may utilize a scheme of randomizing data through a randomizer thereby storing the randomized data. The performance of the randomizer, i.e., how far data can be randomized may affect the reliability of the memory system. Further, the complexity and the memory usage of the randomizer may affect the performance of the memory system.

SUMMARY

In accordance with an embodiment of the present disclosure, a random seed generating circuit of a memory system may include a first address generating circuit, a second address generating circuit, a table circuit and a seed generating circuit. The first address generating circuit may be configured to generate an initial address based on target page information. The second address generating circuit may be configured to generate a plurality of table addresses based on the target page information and a plurality of partial addresses, which are divided from the initial address. The table circuit may be configured to output, from a plurality of tables, a plurality of table values respectively corresponding to the plurality of table addresses. The seed generating circuit may be configured to generate a random seed based on the plurality of table values.

In accordance with an embodiment of the present disclosure, a random seed generating circuit of a memory system may include a first address generating circuit, a second address generating circuit, a table circuit and a seed generating circuit. The first address generating circuit may be configured to generate a plurality of partial addresses based on target page information. The second address generating circuit may be configured to select, based on a page-level index, predetermined first values respectively from predetermined first value groups and configured to convert, based on the predetermined first values, the plurality of partial addresses respectively into a plurality of table addresses. The table circuit may be configured to output, from a plurality of tables, a plurality of table values respectively corresponding to the plurality of table addresses. The seed generating circuit may be configured to generate a random seed based on the plurality of table values.

In accordance with an embodiment of the present disclosure, a random seed generating circuit of a memory system may include an address generating circuit, a table circuit and a seed generating circuit. The address generating circuit may be configured to generate a plurality of table addresses based on target page information. The table circuit may be configured to output, from a plurality of tables, a plurality of table values respectively corresponding to the plurality of table addresses. The seed generating circuit may be configured to perform an add operation on the plurality of table values and configured to generate a random seed based on a result of the add operation.

In accordance with an embodiment of the present disclosure, an operating method of a controller may include: generating plural first data pieces based on information of a storage unit; generating plural second data pieces based on the first data pieces and first values, respectively, the first values being selected respectively from first value groups according to the information and the first value groups corresponding respectively to the first data pieces; selecting plural second values from tables according to values of the second data pieces, respectively, each of the tables having second value entries corresponding respectively to values that a corresponding second data piece can have; generating a random seed based on the selected second values; randomizing data, which is to be stored in the storage unit, with the random seed; and de-randomizing the randomized data, which is read out from the storage unit, with the random seed.

DETAILED DESCRIPTION

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The drawings are not necessarily to scale and, in some instances, proportions may have been exaggerated to clearly illustrate features of the embodiments. The terminology used herein is for the purpose of describing particular embodiments only and is not intended to be limiting of the disclosure.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, various embodiments of the present disclosure will be described below with reference to the accompanying drawings.

In accordance with an embodiment of the present disclosure, provided is a random seed generating circuit of a memory system, the random seed generating circuit having an improved performance with a simple structure.

Figure 1:
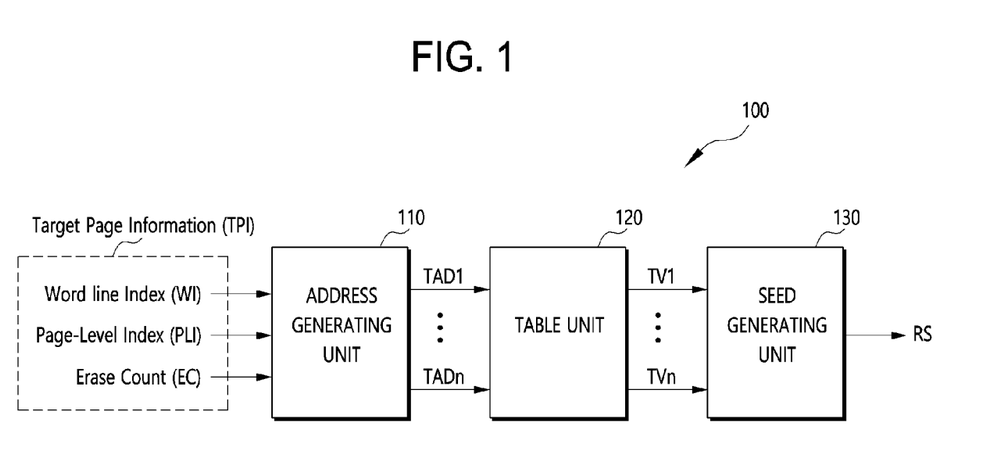
FIG. 1 is a block diagram illustrating a random seed generating circuit of a memory system in accordance with an embodiment of the present disclosure.

FIG. 1 is a block diagram illustrating a random seed generating circuit 100 of a memory system in accordance with an embodiment of the present disclosure.

The random seed generating circuit 100 may be configured to generate a random seed RS to be provided to a randomizer of the memory system. The random seed RS may be utilized for generating a random pattern, with which the randomizer is to randomize data.

The random seed generating circuit 100 may generate the random seed RS based on target page information TPI. The target page information TPI may indicate a location, at which randomized data is to be stored within a storage medium of the memory system, i.e., may indicate a target page. The target page information TPI may include a word line index WI, a page-level index PLI and an erase count EC. Specifically, the target page information TPI may be described as follows when a target page is included in a target memory block within the storage medium and is to be accessed through a target word line among a plurality of word lines coupled to the target memory block.

When the plurality of word lines coupled to the target memory block can be identified through indexes respectively corresponding thereto, the word line index WI may be an index corresponding to the target word line among the indexes. For example, when 16384 number of word lines are coupled to the target memory block and indexes "0" to "16383" respectively correspond to the 16384 number of word lines, the word line index WI may have a value between "0" and "16383" to indicate the target word line among the 16384 number of word lines.

When it is possible to access each of a plurality of pages through the target word line and the plurality of pages can be identified through indexes respectively corresponding thereto, the page-level index PLI may indicate a target page among the plurality of pages. For example, when it is possible to access, through the target word line, each of 4 pages (e.g., a Least Significant Bit (LSB) page, a central Significant Bit (CSB) page, a Most Significant Bit (MSB) page and an Upper Significant Bit (USB) page of a Quad-Level Cell (QLC) NAND flash memory block), and indexes "0" to "3" respectively correspond to the 4 pages, the page-level index PLI may have a value between "0" and "3" to indicate the target page among the 4 pages.

The erase count EC may indicate a number of times that the target page is erased. When the storage medium performs an erase operation in units of memory blocks, the erase count EC may indicate a number of times that the target memory block is erased.

A controller of the memory system may be configured to determine the target page, into which the randomized data is to be stored within the storage medium. Therefore, the controller may be aware of the target page information TPI. Accordingly, the random seed generating circuit 100 included in the controller may generate the random seed RS based on the target page information TPI.

In accordance with an embodiment of the present disclosure, the random seed generating circuit 100 may generate the random seed RS further based on a slice index.

Specifically, the target page may include a plurality of slices and the randomized data may be stored into a target slice among the plurality of slices. In accordance with an embodiment of the present disclosure, the slice may be the smallest unit of storage, which can be addressed within the storage medium. In accordance with an embodiment of the present disclosure, the slice may have a storage capacity corresponding to a data size that can be processed at a time by an error-correction code (ECC) unit of the controller.

When the plurality of slices within the target page can be identified through indexes respectively corresponding thereto, the slice index may indicate a target slice among the plurality of slices. For example, when the target page includes four slices respectively corresponding to indexes "0" to "3", the slice index may have a value between "0" and "3" to indicate the target slice among the 4 slices.

The random seed generating circuit 100 may include an address generating unit 110, a table unit 120 and a seed generating unit 130 (which also can be referred as an address generating circuit, a table circuit and a seed generating circuit, respectively).

The address generating unit 110 may be configured to generate a plurality of table addresses TAD1 to TADn based on the target page information TPI. Specifically, the address generating unit 110 may generate an initial address based on the target page information TPI, may divide the initial address to generate a plurality of partial addresses and may generate the plurality of table addresses TAD1 to TADn based on the plurality of partial addresses and the target page information TPI.

More specifically, the address generating unit 110 may include a first address generating unit and a second address generating unit. The first address generating unit may be configured to generate the initial address based on the target page information TPI. The second address generating unit may be configured to select predetermined values respectively from predetermined value groups based on the target page information TPI. The second address generating unit may be configured to convert the plurality of partial addresses, into which the initial address is divided, respectively to the plurality of table addresses TAD1 to TADn based on the predetermined values.

Since the address generating unit 110 refers to the target page information TPI, data may be randomized and de-randomized through the same random seed RS when storing the data into the target page and reading out the data from the target page.

Further, since the address generating unit 110 refers to the erase count EC, different seeds may be generated for the same target page whenever the erase count EC increases, thereby improving randomness.

The table unit 120 may be configured to output, from a plurality of tables, a plurality of table values TV1 to TVn respectively corresponding to the plurality of table addresses TAD1 to TADn.

The seed generating unit 130 may be configured to generate the random seed RS based on the plurality of table values TV1 to TVn. In accordance with an embodiment of the present disclosure, the seed generating unit 130 may perform an add operation on the plurality of table values TV1 to TVn. Therefore, the randomness of the random seed RS may be improved through the combination of the plurality of table values TV1 to TVn. Further, since the randomness is sufficiently secured through the combination of the plurality of table values TV1 to TVn, each of the plurality of tables of the table unit 120 may keep its performance even when it is configured with a small size, and consequently a memory size occupied for the table unit 120 may be drastically reduced.

Hereinafter, described in detail will be each element within the random seed generating circuit 100. As described below, the random seed generating circuit 100 may provide great randomness even with a relatively simple structure thereof.

Figure 2:
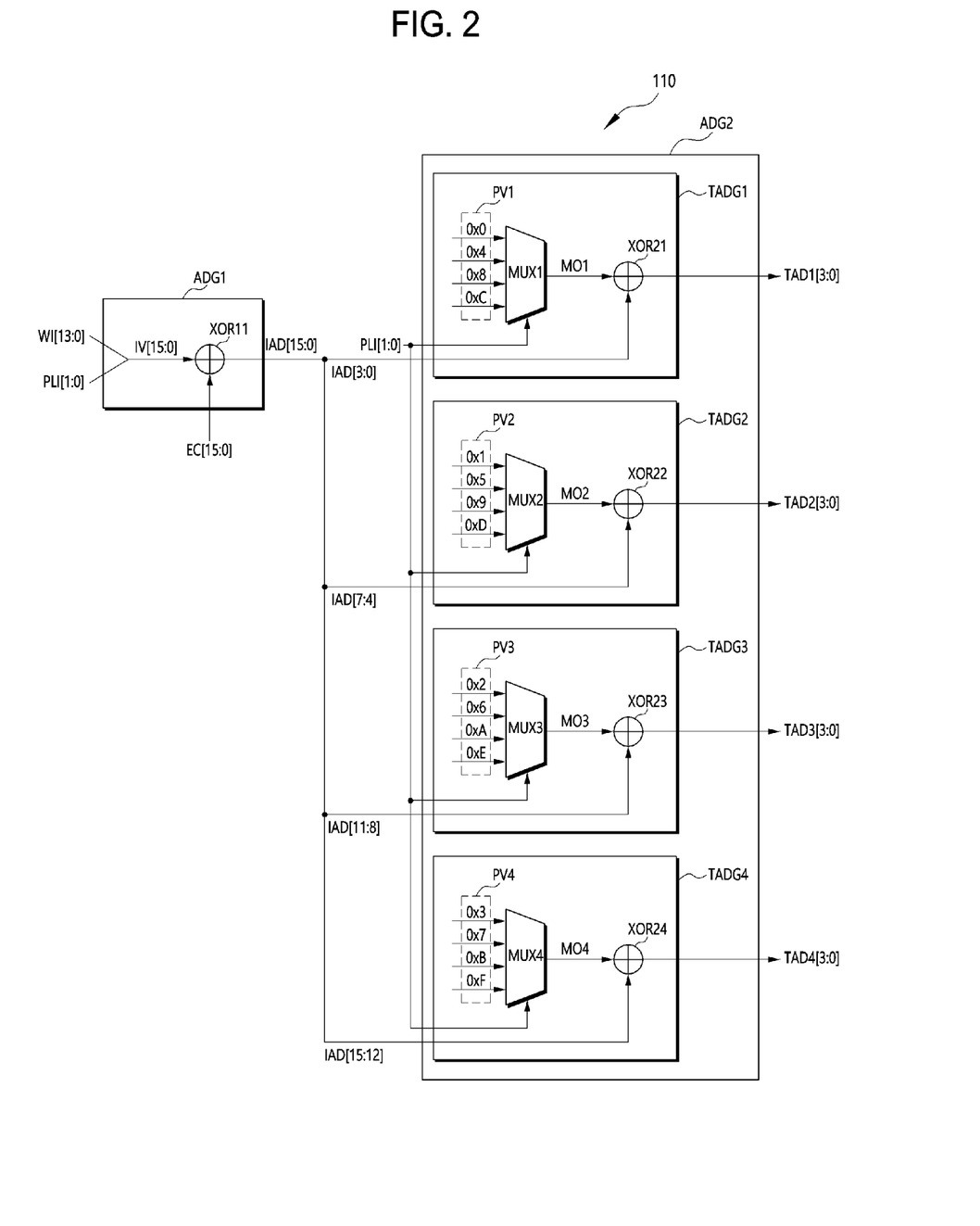
FIG. 2 is a detailed diagram illustrating an address generating unit illustrated in FIG. 1 in accordance with an embodiment of the present disclosure.

FIG. 2 is a detailed diagram illustrating the address generating unit 110 illustrated in FIG. 1 in accordance with an embodiment of the present disclosure.

Referring to FIG. 2, the address generating unit 110 may be configured to generate the plurality of table addresses, for example, first to fourth table addresses TAD1[3:0] to TAD4[3:0] based on the word line index WI[13:0], the page-level index PLI[1:0] and the erase count EC[15:0]. For example, the address generating unit 110 may generate a quantity of 4 of the first to fourth table addresses TAD1[3:0] to TAD4[3:0] each configured by 4 bits based on the word line index WI[13:0] configured by 14 bits, the page-level index PLI[1:0] configured by 2 bits and the erase count EC[15:0] configured by 16 bits, however embodiments of the present disclosure are not limited to a quantity of 4.

The address generating unit 110 may include the first address generating unit ADG1 and the second address generating unit ADG2.

The first address generating unit ADG1 may be configured to generate the initial address IAD[15:0] based on the word line index WI[13:0], the page-level index PLI[1:0] and the erase count EC[15:0].

The second address generating unit ADG2 may be configured to generate the first to fourth table addresses TAD1[3:0] to TAD4[3:0] based on the initial address IAD[15:0] and the page-level index PLI[1:0]. As described later, a number of the table addresses that are generated from the second address generating unit ADG2 may correspond to a number of look-up tables included in the table unit 120. Hereinafter, as an example, the table unit 120 includes 4 look-up tables and thus the second address generating unit ADG2 generates 4 table addresses, i.e., the first to fourth table addresses TAD1[3:0] to TAD4[3:0].

The first address generating unit ADG1 may include an XOR operator XOR11. The first address generating unit ADG1 may be configured to combine the word line index WI[13:0] and the page-level index PLI[1:0] to generate an index value IV[15:0] configured by 16 bits. For example, the first address generating unit ADG1 may configure 14 bits IV[15:2] of the index value IV[15:0] by the word line index WI[13:0] and may configure 2 bits IV[1:0] of the index value IV[15:0] by the page-level index PLI[1:0]. However, how to shuffle the word line index WI[13:0] and the page-level index PLI[1:0] for configuring the index value IV[15:0] will not be limited by this example. For example, even bits of the word line index WI[13:0] and the page-level index PLI[1:0] may become the upper 8 bits of the index value IV[15:0] and odd bits of the word line index WI[13:0] and the page-level index PLI[1:0] may become the lower 8 bits of the index value IV[15:0].

The XOR operator XOR11 may be configured to perform an XOR operation on the index value IV[15:0] and the erase count EC[15:0] and to output a result of the XOR operation as the initial address IAD[15:0].

The second address generating unit ADG2 may include first to fourth table address generating units TADG1 to TADG4 (which also can be referred as the table address generating circuits) configured to respectively generate in parallel the first to fourth table addresses TAD1[3:0] to TAD4[3:0].

The first to fourth table address generating units TADG1 to TADG4 may respectively receive the first to fourth partial addresses IAD[3:0], IAD[7:4], IAD[11:8] and IAD[15:12], which are divided from the initial address IAD[15:0]. For example, the initial address IAD[15:0] may be evenly and sequentially divided by 4 bits into the first to fourth partial addresses IAD[3:0], IAD[7:4], IAD[11:8] and IAD[15:12]. However, embodiments of the present disclosure are not limited to dividing the initial address IAD[15:0] into the partial addresses by 4 bits. For example, the initial address IAD[15:0] may be divided not regularly but irregularly. In accordance with an embodiment of the present disclosure, when the initial address IAD is configured by 'x' number of bits and there are 'y' number of table address generating units, the initial address IAD may be divided by 'x/y' bits into 'y' number of partial addresses. The first address generating unit ADG1 can be described to generate the initial address IAD and also can be described to generate the partial addresses that are divided from the initial address IAD.

Each of the first to fourth table address generating units TADG1 to TADG4 may be configured to generate a corresponding table address of the first to fourth table addresses TAD1[3:0] to TAD4[3:0] based on the page-level index PLI[1:0] and a corresponding partial address of the first to fourth partial addresses IAD[3:0], IAD[7:4], IAD[11:8] and IAD[15:12] of the initial address IAD[15:0]. The first to fourth table address generating units TADG1 to TADG4 may be configured and operate in a similar way to one another. Therefore, hereinafter, described as an example will be the configuration and the operation of the first table address generating unit TADG1.

The first table address generating unit TADG1 may include a selecting unit MUX1 and an XOR operator XOR21.

The selecting unit MUX1 (which also can be referred to as a selecting circuit) may be configured to output, in response to the page-level index PLI[1:0], a predetermined value MO1 from a first predetermined value group PV1 including predetermined values, e.g., 0x0, 0x4, 0x8 and 0xC.

The first predetermined value group PV1 may include the predetermined values, having a number which corresponds to a number of cases (e.g., 4 cases) that can be represented by the page-level index PLI[1:0]. In accordance with an embodiment of the present invention, when a number of cases that can be represented by the page-level index PLI is 'a', the first predetermined value group PV1 may include 'a' number of the predetermined values.

The first predetermined value group PV1 may be stored in a register. The predetermined values within the first predetermined value group PV1 may be determined regardless of the target page information TPI. The predetermined values within the first predetermined value group PV1 may be not changed, i.e., are fixed. However, in accordance with an embodiment of the disclosure, the controller of the memory system may change the predetermined values within the first predetermined value group PV1.

A number of bits configuring each predetermined value within the first predetermined value group PV1 may be a number of bits (e.g., 4 bits) configuring the first partial address IAD[3:0]. As illustrated in FIG. 2, the predetermined values may be different from one another within the first predetermined value group PV1. As illustrated in FIG. 2, in accordance with an embodiment of the present disclosure, the predetermined values may be different from one another within first to fourth predetermined value groups PV1 to PV4, which are respectively utilized by the first to fourth table address generating units TADG1 to TADG4.

In accordance with an embodiment of the present disclosure, the selecting unit MUX1 may be configured to output a predetermined value MO1 of the predetermined values within the first predetermined value group PV1 in response not to the page-level index PLI[1:0] but to bits selected through a result of an operation on one or more of the word line index WI[13:0], the page-level index PLI[1:0] and the erase count EC[15:0] included in the target page information TPI illustrated in FIG. 1.

The XOR operator XOR21 may be configured to perform an XOR operation on the first partial address IAD[3:0] and the predetermined value MO1, which is selected from the predetermined values within the first predetermined value group PV1 in response to the page-level index PLI[1:0], to generate a result of the XOR operation as the first table address TAD1[3:0]. The first partial address IAD[3:0] may be provided from the first address generating unit ADG1. The predetermined value MO1 may be output from the selecting unit MUX1. A number of bits configuring the first table address TAD1[3:0] may be the same as a number of bits configuring the first partial address IAD[3:0].

Figure 3:
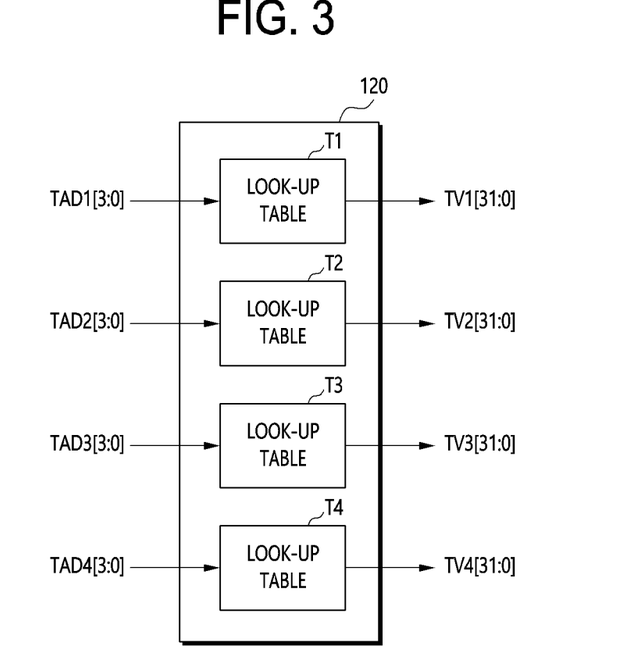
FIG. 3 is a detailed diagram illustrating a table unit illustrated in FIG. 1 in accordance with an embodiment of the present disclosure.

FIG. 3 is a detailed diagram illustrating the table unit 120 illustrated in FIG. 1 in accordance with an embodiment of the present disclosure.

Referring to FIG. 3, the table unit 120 may be configured to output the first to fourth table values TV1[31:0] to TV4[31:0] based on the first to fourth table addresses TAD1[3:0] to TAD4[3:0].

The table unit 120 may include the look-up tables T1 to T4. For example, each of the look-up tables T1 to T4 may include a quantity of 16 entries, which respectively correspond to 16 values that a corresponding table address of 4 bits (e.g., TAD1[3:0]) can have. Each of the 16 entries may have a value configured by 32 bits. However, a number of entries included in each of the look-up tables T1 to T4 and a size of each entry in various embodiments of the present disclosure are not limited by the example.

In accordance with an embodiment of the present disclosure, the look-up tables T1 to T4 may be provided in different memory apparatuses. In accordance with an embodiment of the present disclosure, the look-up tables T1 to T4 may be provided in the same memory apparatus.

The table unit 120 may output, as the first to fourth table values TV1[31:0] to TV4[31:0], entries corresponding to the first to fourth table addresses TAD1[3:0] to TAD4[3:0] from the look-up tables T1 to T4, respectively. For example, the table unit 120 may output, as the first table value TV1[31:0], the entry corresponding to the first table address TAD1[3:0] from the look-up table T1.

Figure 4A:
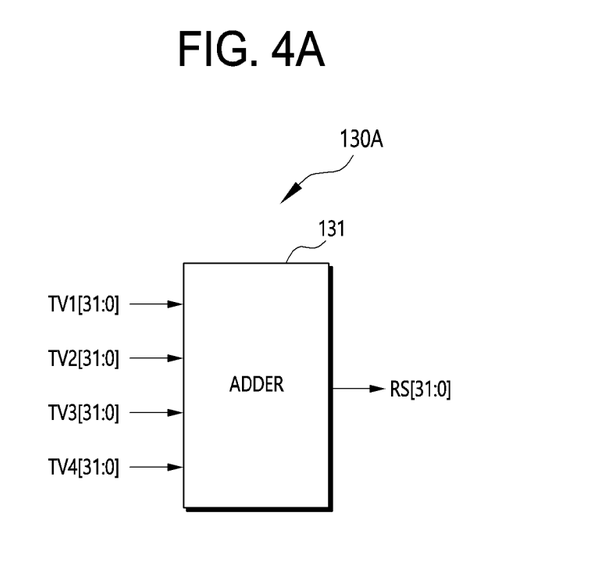
FIGS. 4A and 4B are detailed diagrams illustrating a seed generating unit illustrated in FIG. 1 in accordance with an embodiment of the present disclosure.
Figure 4B:
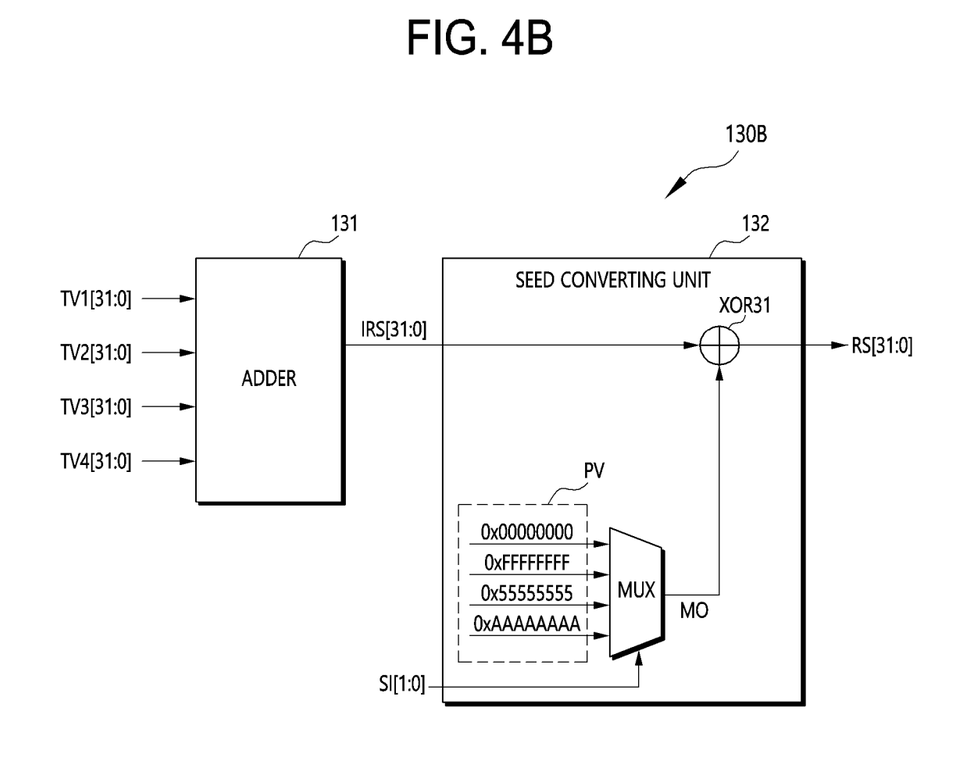

FIGS. 4A and 4B are detailed diagrams illustrating the seed generating unit 130 illustrated in FIG. 1 in accordance with an embodiment of the present disclosure.

Referring to FIG. 4A, a seed generating unit 130A may be an embodiment of the seed generating unit 130 illustrated in FIG. 1. The seed generating unit 130A may be configured to generate the random seed RS[31:0] based on the first to fourth table values TV1[31:0] to TV4[31:0]. The random seed RS[31:0] configured by 32 bits is an example and embodiments of the present disclosure will not be limited by the example.

The seed generating unit 130A may include an adder 131 (which also can be referred to as an adder circuit).

The adder 131 may be configured to perform an add operation on the first to fourth table values TV1[31:0] to TV4[31:0] to generate the random seed RS[31:0] based on a result of the add operation. For example, the adder 131 may perform an add operation on the first to fourth table values TV1[31:0] to TV4[31:0] each configured by 32 bits to generate a result of the add operation, the result being configured by 34 bits. The adder 131 may output, as the random seed RS[31:0], bits of predetermined locations, e.g., the lower 32 bits within the 34-bit result. However, an embodiment of the present disclosure will not be limited to the lower 32 bits selected as the random seed RS[31:0] from the 34-bit result of the adder 131. For example, the adder 131 may output, as the random seed RS[31:0], the upper 32 bits within the 34-bit result.

Referring to FIG. 4B, a seed generating unit 130B may be an embodiment of the seed generating unit 130 illustrated in FIG. 1. The seed generating unit 130B may be configured to generate the random seed RS[31:0] based on the first to fourth table values TV1[31:0] to TV4[31:0] and the slice index SI[1:0].

Specifically, the seed generating unit 130B may include the adder 131 and a seed converting unit 132 (which also can be referred to as a seed converting circuit).

The adder 131 may be configured to perform an add operation on the first to fourth table values TV1[31:0] to TV4[31:0] to generate an initial random seed IRS[31:0] based on a result of the add operation. The configuration and the operation of the adder 131 may be the same as the adder 131 illustrated in FIG. 4A.

The seed converting unit 132 may be configured to output the random seed RS[31:0] based on the slice index SI[1:0] and the initial random seed IRS[31:0] provided from the adder 131.

Specifically, the seed converting unit 132 may include a selecting unit MUX and an XOR operator XOR31.

The selecting unit MUX may be configured to output, in response to the slice index SI[1:0], a predetermined value MO from a predetermined value group PV.

A number of predetermined values within the predetermined value group PV may correspond to a number of cases (e.g., 4 cases) that can be represented by the slice index SI[1:0]. In accordance with an embodiment of the present invention, when a number of cases that can be represented by the slice index SI is 'b', the predetermined value group PV may include 'b' number of the predetermined values.

The predetermined value group PV may be stored in a register. The predetermined values within the predetermined value group PV may be not changed, i.e., are fixed. However, in accordance with an embodiment of the disclosure, the controller of the memory system may change the predetermined values within the predetermined value group PV.

A number of bits configuring each predetermined value within the predetermined value group PV may be a number of bits (e.g., 32 bits) configuring the initial random seed IRS[31:0]. As illustrated in FIG. 4B, the predetermined values may be different from one another within the predetermined value group PV.

The XOR operator XOR31 may be configured to perform an XOR operation on the predetermined value MO, which is selected from the predetermined value group PV by the selecting unit MUX, and the initial random seed IRS[31:0] to generate a result of the XOR operation as the random seed RS[31:0]. The predetermined value MO may be output from the selecting unit MUX. Since each of the predetermined value MO and the initial random seed IRS[31:0] is configured by 32 bits, the random seed RS[31:0] may be configured by 32 bits.

Figure 5:
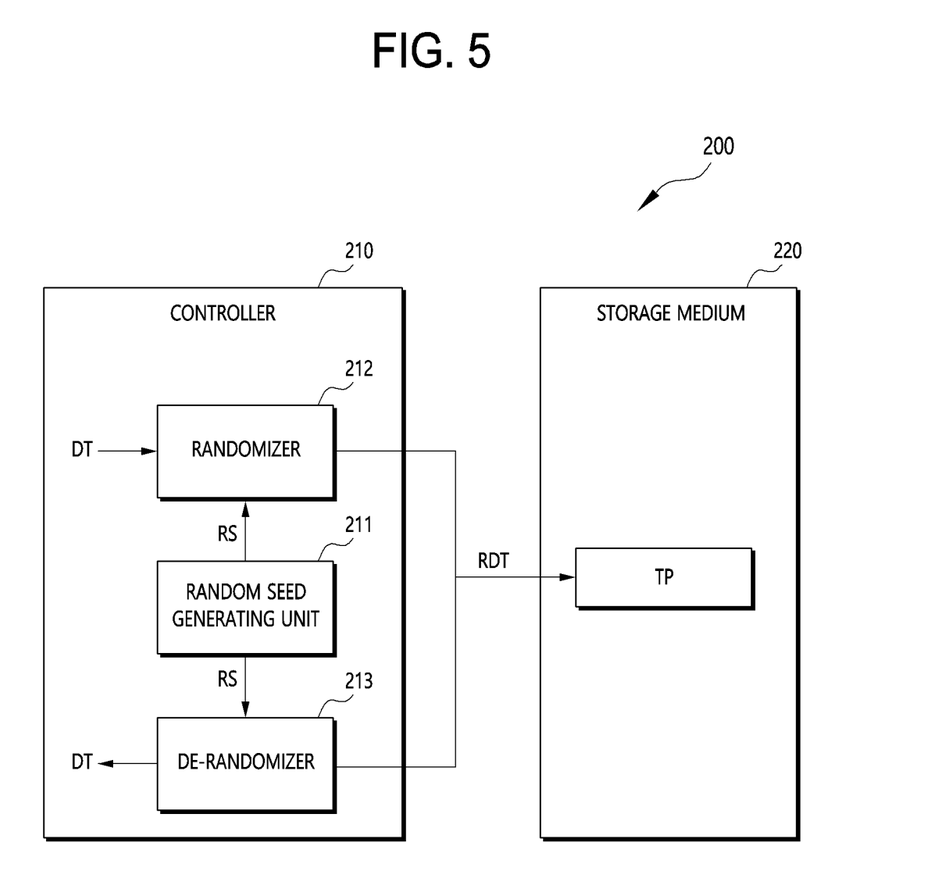
FIG. 5 is a block diagram illustrating a memory system in accordance with an embodiment of the present disclosure.

FIG. 5 is a block diagram illustrating a memory system 200 in accordance with an embodiment of the present disclosure.

Referring to FIG. 5, the memory system 200 may be configured to store therein data, which is provided from an external host device, in response to a write request from the host device. The memory system 200 may be configured to provide an external host device with data, which is stored therein, in response to a read request from the host device.

The memory system 200 may include a Personal Computer Memory Card International Association (PCMCIA) card, a Compact Flash (CF) card, a smart media card, a memory stick, various multimedia cards (e.g., MMC, eMMC, RS-MMC and MMC-micro), Secure Digital (SD) cards (e.g., SD, Mini-SD and Micro-SD), a Universal Flash Storage (UFS) or a Solid State Drive (SSD).

The memory system 200 may include a controller 210 and a storage medium 220.

The controller 210 may control an overall operation of the memory system 200. The controller 210 may control the storage medium 220 to perform a foreground operation in response to an instruction from an external host device. The foreground operation may include operations of writing data into the storage medium 220 and reading data from the storage medium 220 in response to instructions from the host device, that is, a write request and a read request.

Furthermore, the controller 210 may control the storage medium 220 to perform an internally necessary background operation independently of an external host device. The background operation may include at least one of a wear-leveling operation, a garbage collection operation, an erase operation, a read reclaim operation and a refresh operation for the storage medium 220. Like the foreground operation, the background operation may include operations of writing data into the storage medium 220 and reading data from the storage medium 220.

The controller 210 may include a random seed generating unit 211, a randomizer 212 and a de-randomizer 213.

The random seed generating unit 211 may be configured and operate in the same way as the random seed generating unit 100 illustrated in FIG. 1.

The randomizer 212 may be configured to randomize data DT based on the random seed RS generated by the random seed generating unit 211. The controller 210 may store the randomized data RDT into a target page TP, which is related to the target page information TPI and is included in the storage medium 220.

The de-randomizer 213 may be configured to de-randomize data read from the target page TP of the storage medium 220, i.e., the randomized data RDT based on the random seed RS generated by the random seed generating unit 211. Since the random seed generating unit 211 provides the de-randomizer 213 with the random seed RS based on which the randomizer 212 randomizes the data DT, the de-randomizer 213 may recover the original data DT from the randomized data RDT by utilizing the random seed RS.

Under the control of the controller 210, the storage medium 220 may store the randomized data RDT, which is provided from the controller 210, into the target page TP and may read the randomized data RDT from the target page TP to provide the read data to the controller 210.

The storage medium 220 may include a plurality of nonvolatile memory devices. Each of the nonvolatile memory devices may include a flash memory device (e.g., the NAND Flash or the NOR Flash), the Ferroelectrics Random Access Memory (FeRAM), the Phase-Change Random Access Memory (PCRAM), the Magnetic Random Access Memory (MRAM), the Resistive Random Access Memory (ReRAM) and so forth.

Figure 6:
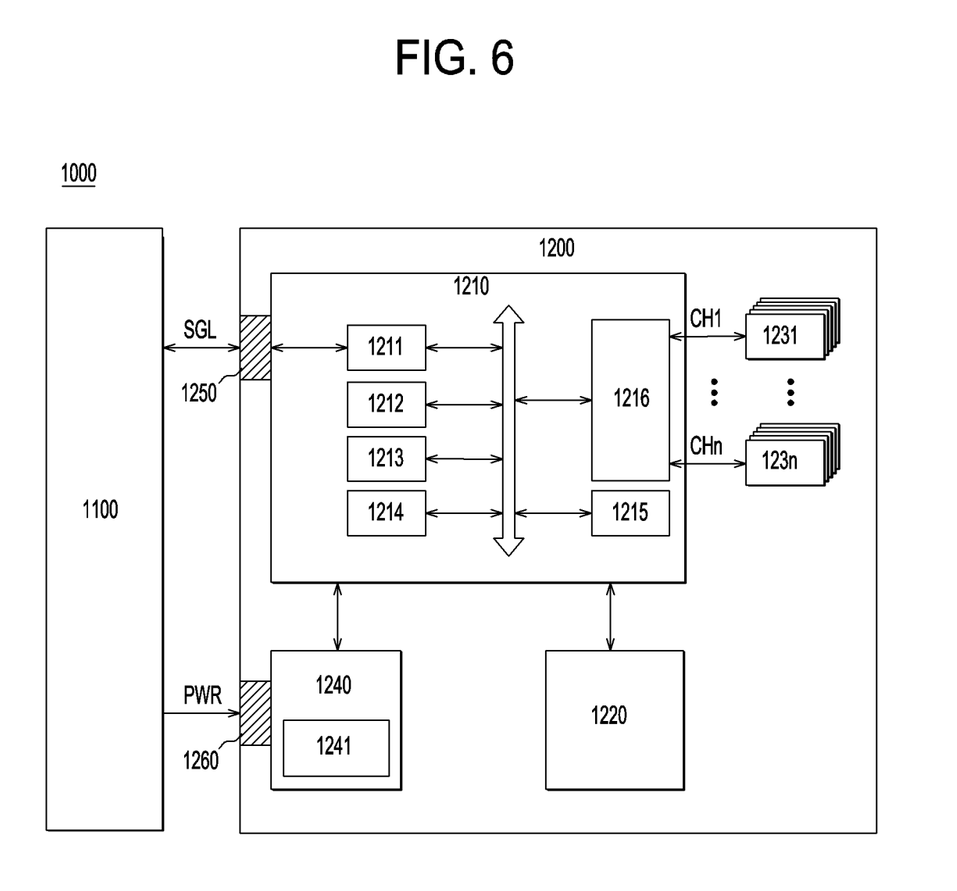
FIG. 6 is a diagram illustrating a data processing system including a solid state drive (SSD) in accordance with an embodiment of the present disclosure.

FIG. 6 is a diagram illustrating a data processing system 1000 including a solid state drive (SSD) 1200 in accordance with an embodiment of the present disclosure. Referring to FIG. 6, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, a randomization unit 1214, an error correction code (ECC) unit 1215, and a memory interface unit 1216.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any of standard communication interfaces or protocols, such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-E) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The randomization unit 1214 may randomize data to be stored in the nonvolatile memory devices 1231 to 123n. The randomization unit 1214 may de-randomize data which is read from the nonvolatile memory devices 1231 to 123n and corrected by the ECC unit 1215. The randomization unit 1214 may include the random seed generating unit 211, the randomizer 212, and the de-randomizer 213.

The ECC unit 1215 may generate the parity data of data randomized by the randomization unit 1214. The generated parity data may be stored together with the randomized data in the nonvolatile memory devices 1231 to 123n. The ECC unit 1215 may detect an error of the data read from at least one of the nonvolatile memory devices 1231 to 123n, based on the parity data. If a detected error is within a correctable range, the ECC unit 1215 may correct the detected error.

The memory interface unit 1216 may provide control signals such as commands and addresses to at least one of the nonvolatile memory devices 1231 to 123n, according to control of the control unit 1212. Moreover, the memory interface unit 1216 may exchange data with at least one of the nonvolatile memory devices 1231 to 123n, according to control of the control unit 1212. For example, the memory interface unit 1216 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 7:
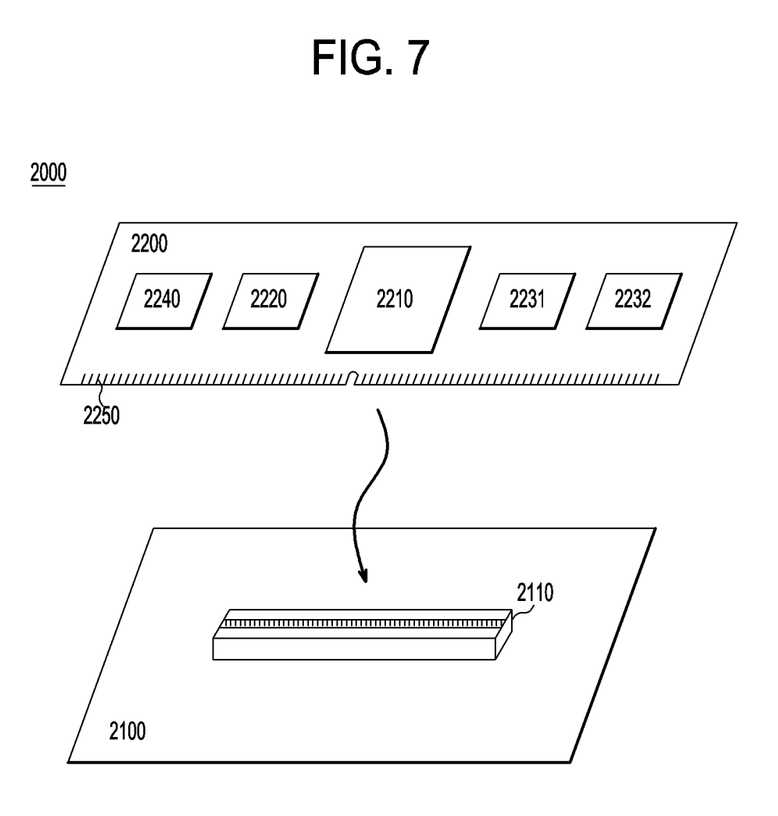
FIG. 7 is a diagram illustrating a data processing system including a memory system in accordance with an embodiment of the present disclosure.

FIG. 7 is a diagram illustrating a data processing system 2000 including a memory system 2200 in accordance with an embodiment of the present disclosure. Referring to FIG. 7, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 6.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth, and power may be transferred between the host device 2100 and the memory system 2200. The connection terminal 2250 may be configured into various types depending on an interface scheme between the host device 2100 and the memory system 2200. The connection terminal 2250 may be disposed on any side of the memory system 2200.

Figure 8:
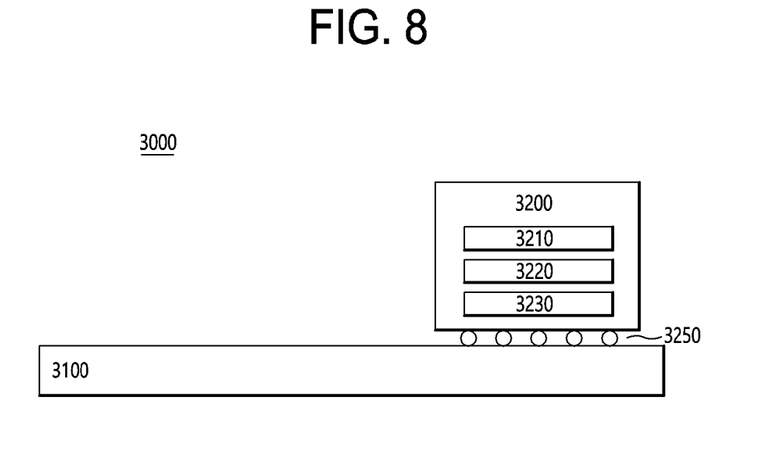
FIG. 8 is a diagram illustrating a data processing system including a memory system in accordance with an embodiment of the present disclosure.

FIG. 8 is a diagram illustrating a data processing system 3000 including a memory system 3200 in accordance with an embodiment of the present disclosure. Referring to FIG. 8, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 6.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 9:
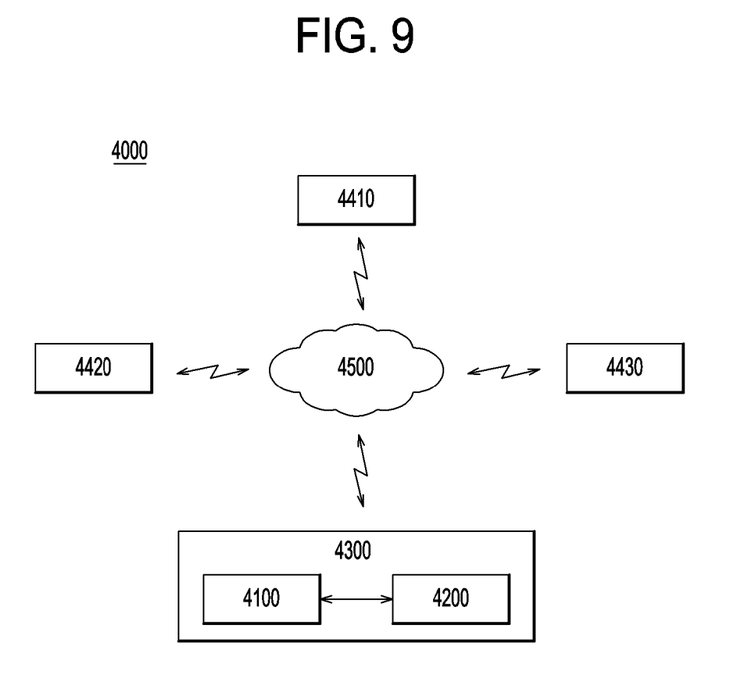
FIG. 9 is a diagram illustrating a network system including a memory system in accordance with an embodiment of the present disclosure.

FIG. 9 is a diagram illustrating a network system 4000 including a memory system 4200 in accordance with an embodiment of the present disclosure. Referring to FIG. 9, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 200 shown in FIG. 5, the SSD 1200 shown in FIG. 6, the memory system 2200 shown in FIG. 7 or the memory system 3200 shown in FIG. 8.

Figure 10:
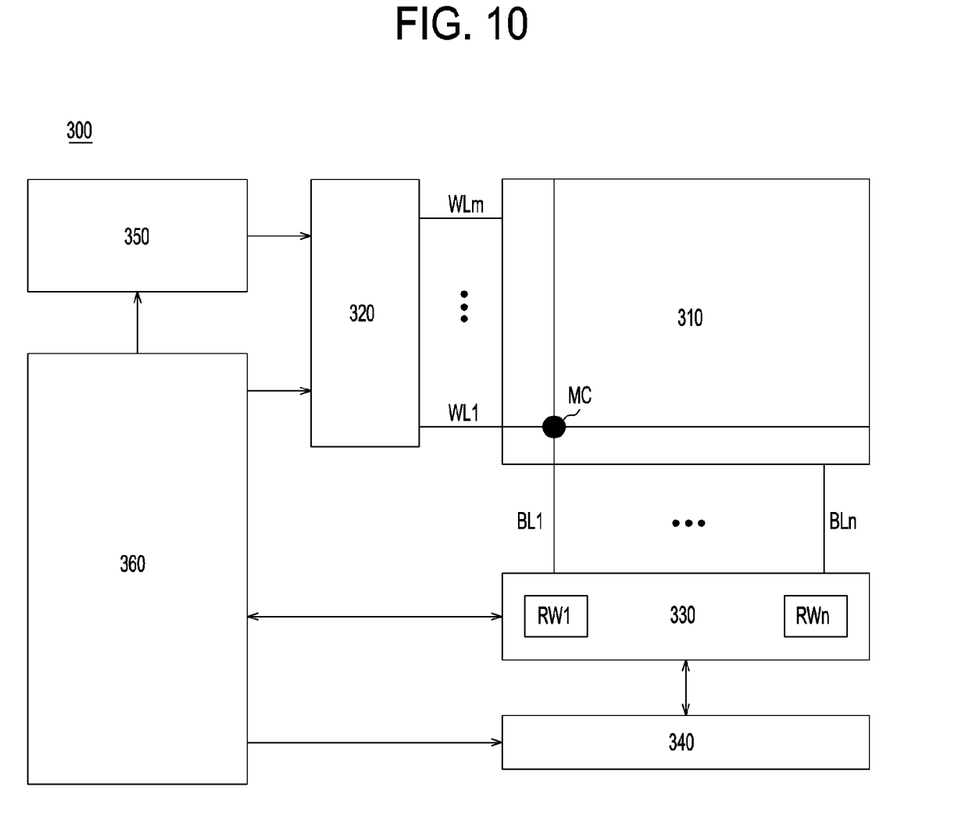
FIG. 10 is a block diagram illustrating a nonvolatile memory device included in a memory system in accordance with an embodiment of the present disclosure.

FIG. 10 is a block diagram illustrating a nonvolatile memory device 300 included in a memory system in accordance with an embodiment of the present disclosure. Referring to FIG. 10, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. In another example, an erase voltage generated in an erase operation may be applied to a well area of memory cells for which the erase operation is to be performed. In still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

In accordance with an embodiment of the present disclosure, provided is a random seed generating circuit of a memory system, the random seed generating circuit having an improved performance with a simple structure.

While certain embodiments have been described above, it will be understood to those skilled in the art that the embodiments described are by way of example only. The embodiments may be combined to form additional embodiments. Accordingly, the random seed generating circuit of a memory system should not be limited based on the described embodiments. Rather, the random seed generating circuit of a memory system described herein should only be limited in light of the claims that follow when taken in conjunction with the above description and accompanying drawings.

What is claimed is:

1. A random seed generating circuit of a memory system, the random seed generating circuit comprising:
   a first address generating circuit configured to generate an initial address based on target page information;
   a second address generating circuit configured to generate a plurality of table addresses based on the target page information and a plurality of partial addresses, which are divided from the initial address;
   a table circuit configured to output, from a plurality of tables, a plurality of table values respectively corresponding to the plurality of table addresses; and
   a seed generating circuit configured to generate a random seed based on the plurality of table values.

2. The random seed generating circuit of claim 1, wherein the target page information includes a word line index, a page-level index and an erase count corresponding to a target page.

3. The random seed generating circuit of claim 2, wherein the first address generating circuit is configured to combine the word line index and the page-level index to generate an index value and configured to perform an XOR operation on the index value and the erase count to generate the initial address.

4. The random seed generating circuit of claim 1,
   wherein the second address generating circuit includes a plurality of table address generating circuits, and
   wherein each of the plurality of table address generating circuits is configured to generate a corresponding table address among the plurality of table addresses based on the target page information and a corresponding partial address among the plurality of partial addresses.

5. The random seed generating circuit of claim 4, wherein each of the plurality of table address generating circuits includes:
   a selecting circuit configured to output, in response to the target page information, a predetermined value from a plurality of predetermined values; and
   an XOR operator configured to perform an XOR operation on the predetermined value and the corresponding partial address to generate the corresponding table address.

6. The random seed generating circuit of claim 5, wherein the plurality of predetermined values are different from one another.

7. The random seed generating circuit of claim 1, wherein the seed generating circuit is configured to perform an add operation on the plurality of table values and configured to select, as the random seed, bits of predetermined locations within a result of the add operation.

8. The random seed generating circuit of claim 1, wherein the seed generating circuit includes:
   an adder circuit configured to perform an add operation on the plurality of table values and configured to select, as an initial random seed, bits of predetermined locations within a result of the add operation; and
   a seed converting circuit configured to generate the random seed based on the initial random seed and a slice index.

9. The random seed generating circuit of claim 8, wherein the seed converting circuit includes:
   a selecting circuit configured to output, in response to the slice index, a predetermined value from a plurality of predetermined values; and
   an XOR operator configured to perform an XOR operation on the predetermined value and the initial random seed to generate the random seed.

10. A random seed generating circuit of a memory system, the random seed generating circuit comprising:
    a first address generating circuit configured to generate a plurality of partial addresses based on target page information;
    a second address generating circuit configured to select, based on a page-level index, predetermined first values respectively from predetermined first value groups and configured to convert, based on the predetermined first values, the plurality of partial addresses respectively into a plurality of table addresses;
    a table circuit configured to output, from a plurality of tables, a plurality of table values respectively corresponding to the plurality of table addresses; and
    a seed generating circuit configured to generate a random seed based on the plurality of table values.

11. The random seed generating circuit of claim 10,
    wherein the target page information includes a word line index, the page-level index and an erase count corresponding to a target page, and
    wherein the first address generating circuit is configured to combine the word line index and the page-level index to generate an index value and configured to perform an XOR operation on the index value and the erase count to generate an initial address, which is to be divided into the plurality of partial addresses.

12. The random seed generating circuit of claim 10, wherein the second address generating circuit includes a plurality of table address generating circuits configured to receive the plurality of partial addresses to output the plurality of table addresses, respectively, and
    wherein each of the plurality of table address generating circuits includes:
    a selecting circuit configured to receive a corresponding predetermined first value group among the predetermined first value groups and configured to output, in response to the page-level index, a predetermined first value from the corresponding predetermined first value group; and
    an XOR operator configured to perform an XOR operation on the predetermined first value and a corresponding partial address to generate a corresponding table address.

13. The random seed generating circuit of claim 10, wherein the seed generating circuit includes:
    an adder circuit configured to perform an add operation on the plurality of table values and configured to select, as an initial random seed, bits of predetermined locations within a result of the add operation; and
    a seed converting circuit configured to generate the random seed based on the initial random seed and a slice index.

14. The random seed generating circuit of claim 13, wherein the seed converting circuit includes:
    a selecting circuit configured to output, in response to the slice index, a predetermined second value from a plurality of predetermined second values; and
    an XOR operator configured to perform an XOR operation on the predetermined second value and the initial random seed to generate the random seed.

15. A random seed generating circuit of a memory system, the random seed generating circuit comprising:
    an address generating circuit configured to generate a plurality of table addresses based on target page information;
    a table circuit configured to output, from a plurality of tables, a plurality of table values respectively corresponding to the plurality of table addresses; and
    a seed generating circuit configured to perform an add operation on the plurality of table values to generate a result of the add operation with more bits than a bit length of each of the plurality of table values and configured to generate a random seed based on the result of the add operation.

16. The random seed generating circuit of claim 15, wherein the address generating circuit includes:
    a first address generating circuit configured to generate an initial address based on the target page information; and
    a second address generating circuit configured to generate the plurality of table addresses based on the target page information and a plurality of partial addresses, which are divided from the initial address.

17. The random seed generating circuit of claim 16,
    wherein the target page information includes a word line index, a page-level index and an erase count corresponding to a target page, and
    wherein the first address generating circuit is configured to combine the word line index and the page-level index to generate an index value and configured to perform an XOR operation on the index value and the erase count to generate the initial address.

18. The random seed generating circuit of claim 16,
    wherein the second address generating circuit includes a plurality of table address generating circuits, and wherein each of the plurality of table address generating circuits is configured to generate a corresponding table address among the plurality of table addresses based on the target page information and a corresponding partial address among the plurality of partial addresses.

19. The random seed generating circuit of claim 18, wherein each of the plurality of table address generating circuits includes:
   a selecting circuit configured to output, in response to the target page information, a predetermined value from a plurality of predetermined values; and
   an XOR operator configured to perform an XOR operation on the predetermined value and the corresponding partial address to generate the corresponding table address.

20. The random seed generating circuit of claim 15, wherein the seed generating circuit includes:
   an adder circuit configured to perform the add operation and configured to select, as an initial random seed, bits of predetermined locations within the result of the add operation; and
   a seed converting circuit configured to generate the random seed based on the initial random seed and a slice index.

21. The random seed generating circuit of claim 20, wherein the seed converting circuit includes:
   a selecting circuit configured to output, in response to the slice index, a predetermined value from a plurality of predetermined values; and
   an XOR operator configured to perform an XOR operation on the predetermined value and the initial random seed to generate the random seed.

\* \* \* \* \*